United States Patent [19]

Ustuner et al.

[11] Patent Number: 5,479,926
[45] Date of Patent: Jan. 2, 1996

[54] IMAGING SYSTEM DISPLAY PROCESSOR

[75] Inventors: Kutay Ustuner, Mt. View; Matthew I. Haller, San Francisco; Ting-Lan Ji, Mt. View; Pai-Chi Li, Sunnyvale, all of Calif.; Can Cinbis, Shoreview, Minn.

[73] Assignee: Acuson Corporation, Mountain View, Calif.

[21] Appl. No.: 401,715

[22] Filed: Mar. 10, 1995

[51] Int. Cl.⁶ .................................... A61B 8/00
[52] U.S. Cl. .................... 128/660.04; 348/224
[58] Field of Search ............. 128/660.04, 660.05, 128/660.07; 73/602, 625; 358/335; 348/223, 224, 225, 242

[56] References Cited

U.S. PATENT DOCUMENTS

| | | | |
|---|---|---|---|
| 4,783,839 | 11/1988 | Bamber. | |
| 4,787,393 | 11/1988 | Fukukita et al. | 128/660.04 |
| 5,090,411 | 2/1992 | Higuchi | 128/660.05 |
| 5,224,483 | 7/1993 | Lipschutz. | |
| 5,264,944 | 11/1993 | Takemura | 358/335 |

*Primary Examiner*—George Manuel
*Attorney, Agent, or Firm*—Willian Brinks Hofer Gilson & Lione

[57] ABSTRACT

A display processor for an ultrasonic imaging system includes a two-dimensional filter to generate a smoothed image signal $I_p$ from a high spatial resolution image signal $I_D$. $I_p$ is optimized for high contrast resolution and good tissue differentiation, and $I_D$ is optimized for high detail resolution and the display of fine structural details. $I_p$ and $I_D$ are applied as addressing inputs to a look-up table that provides an output image signal $I_O$ that combines both detail resolution of $I_D$ and contrast resolution of $I_p$. $I_O$ can display detail resolution as brightness and contrast resolution as color. $I_O$ can also be formed as a weighted combination or sum of $I_p$ and $I_D$.

19 Claims, 4 Drawing Sheets

IMAGING SYSTEM DISPLAY PROCESSOR

BACKGROUND OF THE INVENTION

This invention relates to imaging systems, and in particular to a display processor that enhances the simultaneous display of multiple types of resolution in such systems.

Ultrasound images are used diagnostically for two different purposes: the display of structural details of tissue, and the differentiation of different types of tissue. A high spatial resolution (or detail resolution) in the image maximizes the ability of the user to detect fine structural details. A high contrast resolution in the image maximizes the user's ability to detect tissue type differences.

One of the fundamental limitations on contrast resolution is speckle noise. Speckle noise is inherent to coherent imaging systems and is caused by coherent (phase-sensitive) interference of waves scattered by structures too fine to be resolved. Speckle noise does not carry information on the structural details of the object, but its low frequency components carry information on the mean backscattering strength of the object. For this reason, high frequency components of speckle noise should be reduced in order to improve contrast resolution.

Various signal processing techniques have been used to improve contrast resolution. Low-pass video filters, low-pass scan conversion filters, and even the limited bandwidth of the display monitor can be used to reduce high-frequency spatial variations of speckle noise. In this way, differences in mean backscattering strength from one tissue to another can be significantly accentuated. The spatial smoothing associated with this approach to improving contrast resolution significantly reduces detail resolution.

Bamber U.S. Pat. No. 4,783,839 discloses a system for reducing speckle noise that varies the amount of smoothing across the image as a function of how closely individual regions of the image resemble speckle. In many cases speckle noise is superimposed on resolvable structural details of the object, and diagnostically useful detail resolution therefore can be lost.

Non-linear display mapping is another signal processing technique that has been used to improve contrast resolution. Especially when cascaded with smoothing video filters, non-linear display maps can increase contrast resolution at selected display intensity levels at the expense of reduced detail and contrast resolution at all other display intensity levels.

Speckle noise can also be reduced during image formation by any of several incoherent averaging (compounding) techniques, including spatial, frequency, and temporal compounding.

Spatial compounding during image formation can be accomplished by shifting the transducer in the lateral, axial, or elevational direction. Frequency compounding is performed by dividing the passband of input pulses into several sub-bands in the frequency domain. Temporal compounding produces images by incoherently summing range intensity samples.

These compounding techniques exploit the fact that the ensemble average of a speckle image is the same as the incoherent average of the original object. Since the mottled appearance of speckle noise carries information only about the imaging device and not the imaged object, speckle variations can be reduced by incoherently averaging independent measurements without altering original target contrast. Reduced speckle variation results in improved contrast resolution at the price of reduced detail resolution.

Lipschultz U.S. Pat. No. 5,224,483 discloses a system for enhancing an ultrasound image by reducing clutter in a blood pool area of the image. The blood pool areas are identified by means of low-pass filtering and non-linear intensity mapping, and a mask signal is generated having substantially a first value in areas of tissue and substantially a second value in areas of blood pool. The image signal is then modulated with the mask signal to substantially remove clutter in the blood pool. The mask signal preferably is not strictly binary, but contains some intermediate levels to provide a smooth transition between masked and unmasked regions, so as to prevent an unnatural appearance of the final image. This technique only suppresses clutter in blood pool areas, and does not address the problem of improved contrast resolution in tissue areas.

A need exists for an improved image processor that enhances contrast resolution to improve differentiability of tissue types (liver versus kidney, healthy tissue versus lesion) without losing diagnostically important fine structural details of the image.

SUMMARY OF THE INVENTION

According to this invention, an imaging system display processor is responsive to first and second image signals depicting a common entity. The first image signal has greater detail resolution than the second image signal, while the second image signal has greater contrast resolution than the first image signal. The display processor forms an output signal as a function of the two image signals such that the output signal combines detail information of the first image signal and contrast information of the second image signal.

The display processor preferably comprises a display generator such as a two-dimensional map. In some embodiments the output signal is characterized by an intensity which displays detail resolution of the first image signal and a color which displays contrast resolution of the second image signal. In other embodiments the output signal is formed as a weighted sum of the first and second image signals, and the weighted sum comprises a weighing factor that varies in accordance with both of the first and second image signals.

DETAILED DESCRIPTION OF THE PRESENTLY PREFERRED EMBODIMENTS

Figure 1:
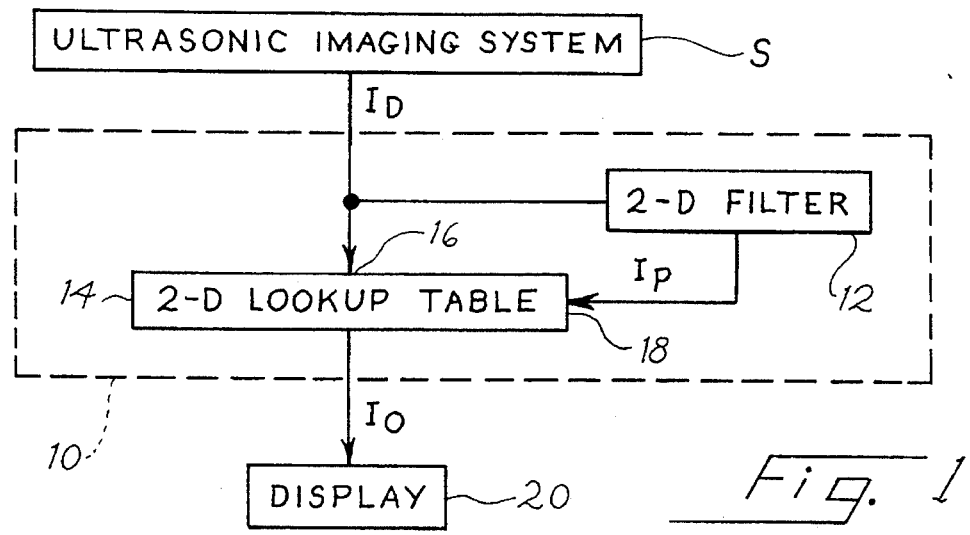
FIG. 1 is a block diagram of an ultrasonic imaging system that incorporates a preferred embodiment of this invention.

Turning now to the drawings, FIG. 1 is a block diagram of a first preferred embodiment of this invention, which responds to a high detail resolution image signal $I_D$ generated by any suitable ultrasonic imaging system S. The system S is conventional, and in this embodiment the signal $I_D$ is a standard B-mode image signal that varies in intensity as a function of the backscattering coefficient of the tissue. Of course, this invention is not limited to use with B-mode image signals, and ultrasonic imaging systems that monitor any other suitable acoustic properties of tissue (including but not limited to attenuation coefficient, speed of sound, and elasticity) can also be used with this invention. The image signal $I_D$ can be an unprocessed image signal, or an image signal with some amount of video filtering (either smoothed or edge enhanced).

As shown in FIG. 1, the image signal $I_D$ is applied as an input to a display processor 10 that includes a two dimensional filter 12 and a display generator 14 such as a two dimensional lookup table. The two dimensional filter 12 can be a video filter which generates as an output a processed, high contrast resolution image signal $I_p$. The image signal $I_p$ has lower detail resolution and higher contrast resolution than the image signal $I_D$.

The degree of smoothing provided by the filter 12 is selected to enhance contrast resolution and therefore differentiability of different tissue types. Generally, the image signal $I_p$ is a multi-level signal that varies across tissues of varying types and in which major regions of differing types of solid tissue can be distinguished from one another. For example, the image signal $I_p$ for a region including blood pool and at least first and second types of solid tissue preferably allows the blood pool to be distinguished from the solid tissue, and the first and second types of solid tissue to be distinguished from each other. The size and shape of the two-dimensional spatial filter 12 can vary widely, as suitable for the application and the body type of the patient. Multiple user selectable filters can be provided, or a single filter can be user-adjustable.

Figure 2:
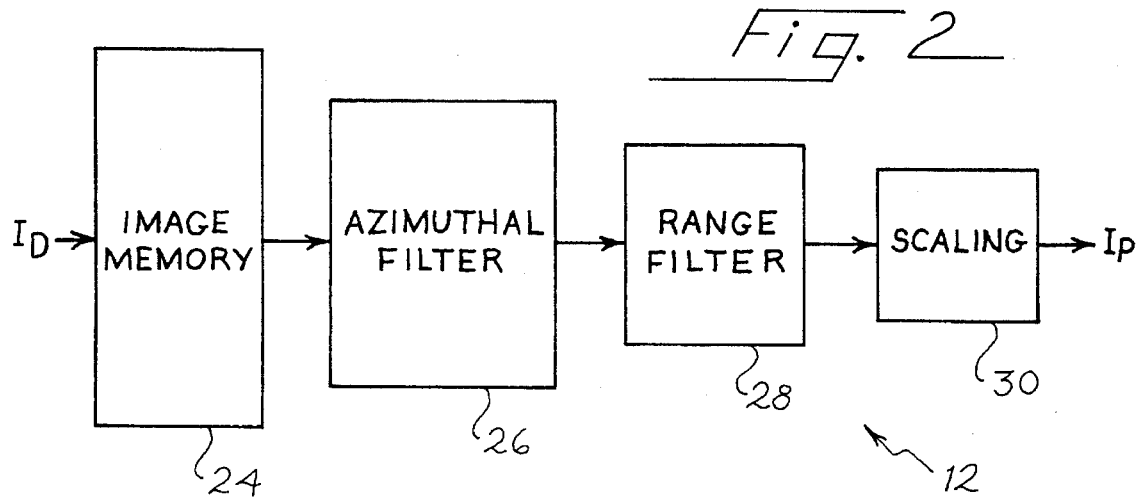
FIG. 2 is a block diagram of the filter of FIG. 1.
Figure 3:
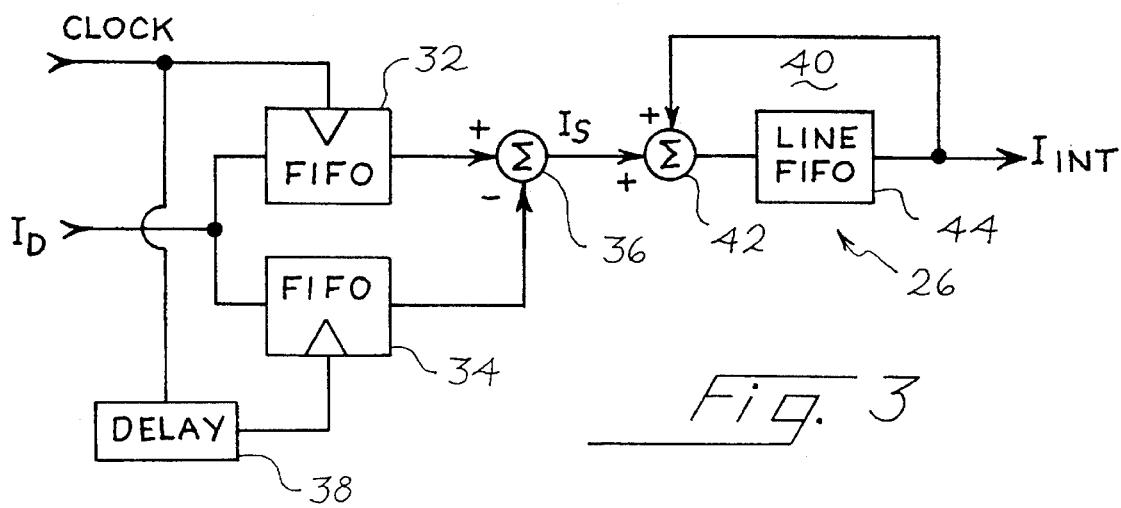
FIG. 3 is a block diagram of the azimuthal filter of FIG. 2.
Figure 4:
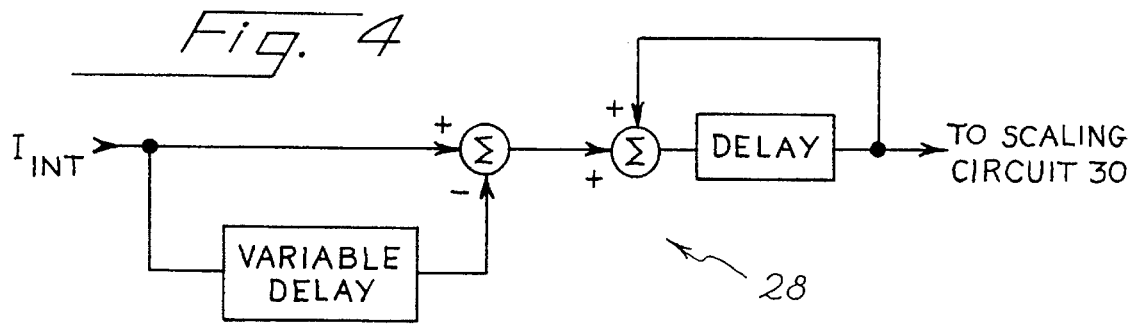
FIG. 4 is a block diagram of the range filter of FIG. 2.

Many implementations for the two dimensional spatial filter 12 are known to those skilled in the art. One suitable approach is shown in FIGS. 2–4, and includes an image memory 24, an azimuthal filter 26, a range filter 28, and a scaling circuit 30. The image memory 24 stores lines of acoustic data obtained from the detail image signal $I_D$, the range filter 28 filters along the lines, and the azimuthal filter 26 filters between lines.

As shown in FIG. 3, the azimuthal filter 26 includes 2 FIFO registers 32, 34, which both receive the same image signal from the memory 24. The registers supply output signals to a summer 36 under control of a clock signal. A delay element 38 shifts the output signal of the register 34 in time by an amount $D_1$ equal to a desired number of lines. Assuming the original image signal is $I_D(1_n, t_n)$, where $1_n$ is the line number and $t_n$ is the range sample number, then the output $I_s$ of the summer 36 can be expressed as follows:

$$I_S(1_n, t_n) = I_D(1_n, t_n) - I_D(L_n - D_1, t_n).$$

The signal $I_S$ is then applied to an accumulator 40, which includes a summer 42 and a line FIFO register 44. The accumulator 40 integrates the line data and generates an output signal $I_{INT}$:

$$I_{INT}(l_n, t_n) = \sum_{l_n'=l_n}^{l_n+D_1-1} I_D(l_n', t_n).$$

$I_{INT}$ is therefore the sum of $D_1$ adjacent lines. This corresponds to a box-car filter of size $D_1$.

FIG. 4 provides details of the range filter 28, which calculates difference and accumulates as a function of range sample number rather than line number. Otherwise, the range filter 28 functions in a similar manner to the azimuthal filter 26 discussed above.

The size of the two-dimensional filter 12 can be selected between upper and lower limits. The upper limit is equal to the size of the smallest lesion or other tissue type to be detected. The lower limit is affected by the average speckle size and the desired improvement in contrast to noise ratio (CNR). Average speckle size is equal to the area (e.g., at −6.8dB) of the autocorrelation of the point spread function. CNR is defined as follows:

$$CNR = \frac{\Delta I}{(\sigma_b^2 + \sigma_l^2)^{1/2}}$$

$\Delta I$ is the average intensity (backscattering coefficient) difference between the lesion and background, and $\sigma_b^2$ and $\sigma_l^2$ are the variances of the background and the lesion, respectively. If CNR is to be increased by 3 dB, filter size should be set equal to the average speckle size.

In embodiments such as that of FIG. 1, where $I_p$ is generated from $I_D$, the high detail resolution of $I_D$ benefits the contrast resolution of $I_p$. This is because a higher detail resolution brings with it more independent samples that are available for processing (averaging). The improvement is proportional to the square root of the number of independent samples. As explained above, high detail resolution is not a sufficient condition for high contrast resolution, since high spatial frequency components of the image signal $I_D$ can have an adverse effect on a user's ability to perceive contrast differences in the image.

It is not essential that the high contrast resolution image signal $I_p$ must be obtained from the image signal $I_D$ with a video filter. Other techniques such as other types of spatial filtering, frequency compounding, temporal compounding, spatial compounding, combinations of these techniques, and other speckle reduction techniques can be used. In some cases it may be preferable to use beam formation techniques to generate the image signals $I_p$ and $I_D$ directly. In this case there may be no need to include any type of two dimensional filter in the image processor. Generally, it is simpler to process the same beam-formed image signal twice (once for detail resolution to create $I_D$ and once for contrast resolution to create $I_p$).

Once $I_D$ and $I_p$ have been formed as described above, they are then applied to first and second inputs 16, 18 of the display generator 14, which generates an output image signal $I_O$. $I_O$ combines or superimposes the detail information of $I_D$ with the contrast information of $I_p$ so that superimposed detail and contrast information are both preserved, and the human eye can distinguish both when the signal $I_O$ is displayed on a monitor 20. At higher spatial resolutions, $I_O$ varies in accordance with $I_D$. At lower spatial resolutions $I_O$ varies in accordance with $I_p$.

Thus, the output image signal $I_O$ is a composite of the signal $I_D$, which is acquired and processed to maximize detail resolution, and the signal $I_p$, which is acquired and processed to maximize contrast resolution.

In this embodiment, the display generator 14 is a two dimensional look-up table in which $I_D$ and $I_p$ are used as addresses to select the corresponding stored value $I_O$ from the table. $I_D$ and $I_p$ are synchronized such that at any given point in time they relate to the same physical region of the object being imaged.

The look-up table of the display generator 14 in this embodiment is a color table that assigns a pixel value to $I_O$ based on both $I_D$ and $I_p$ as in equation (1):

$$I_O = F(I_p, I_D) \tag{1}$$

Figure 5:
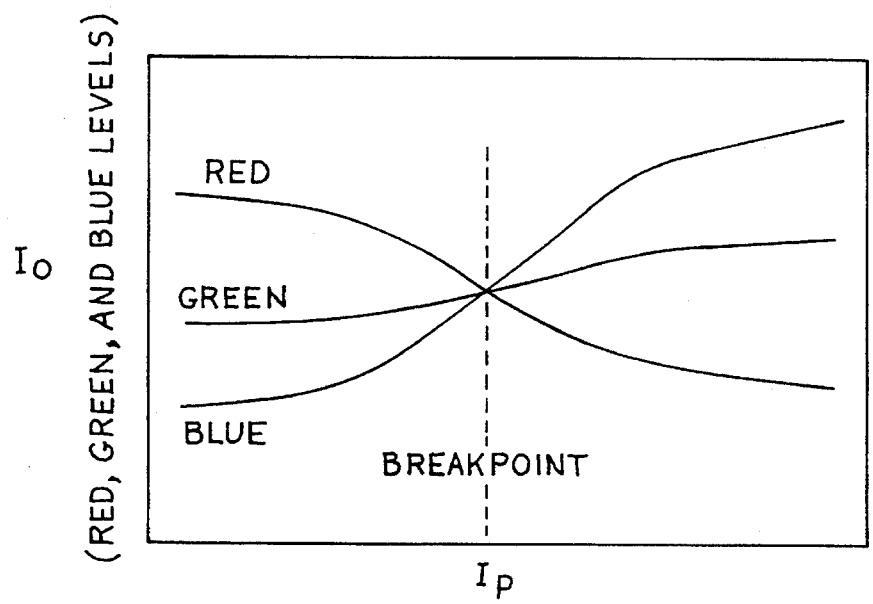
FIG. 5 is a graph relating to a first preferred embodiment of the display generator of FIG. 1.

The function F in equation (1) can be thought of as a vector function, with each component of the vector function corresponding to a display color. When a conventional RGB (red-green-blue) monitor 20 is used, F is preferably a three-dimensional vector function. When the red, green and blue components are set to be equal to one another, the corresponding value of $I_O$ will be a gray scale value. The exact shape of F can be set to emphasize various aspects of image quality. For example, F can be set to reduce noise by having a low value of F when $I_p$ is low, even if $I_D$ is high. Contrast resolution and detail resolution are both preserved in $I_p$ by setting F such that the brightness of a particular pixel of $I_O$ varies with $I_D$ while the color of this pixel varies with $I_p$. When this is done, two different tissues which differ in contrast levels will be displayed in different colors. FIG. 5 shows one possible shape for the three components of a three-dimensional F for a given value of $I_D$ and varying values of $I_p$.

The following equations 2–5 can be used to determine red, green, and blue components of $I_O$ as a function of $I_D$ and $I_p$:

$$I_O = I_D \cdot K_{R,G,B}(I_p); \tag{2}$$

$$I_D' = \gamma I_D + (1-\gamma) I_p; \tag{3}$$

$$\gamma = \frac{1-\beta}{1 + \left(\frac{|I_P - I_D|}{\tan(.5\pi(1-\alpha))}\right)^6}; \tag{4}$$

$$K_{R,G,B}(I_P) = L_{R,G,B} + \frac{(H_{R,G,B} - L_{R,G,B})}{(1 + \exp(-4 S_{R,G,B}(I_P - B_{R,G,B})))}. \tag{5}$$

The following constants can be used in Eq. 2–5, where subscripts R,G,B are used for the red, green and blue components, respectively:

$L_R$=0.5, $L_G$=0.8, $L_B$=0.6;

$H_R$=1, $H_G$=0.9, $H_B$=0.9;

$S_R$=2, $S_G$=2, $S_B$=2;

$B_R$=0.2, $B_G$=0.2, $B_B$=0.2;

$\alpha$=0.7, $\beta$=0.1.

With this approach, the image signal $I_D$ with optimized detail resolution is superimposed on the image signal $I_p$ with optimized contrast resolution by color shading. In this way enhanced contrast information and enhanced detail information are presented simultaneously via the signal $I_O$ on the monitor 20, and both types of information can be perceived by the user.

Figure 6:
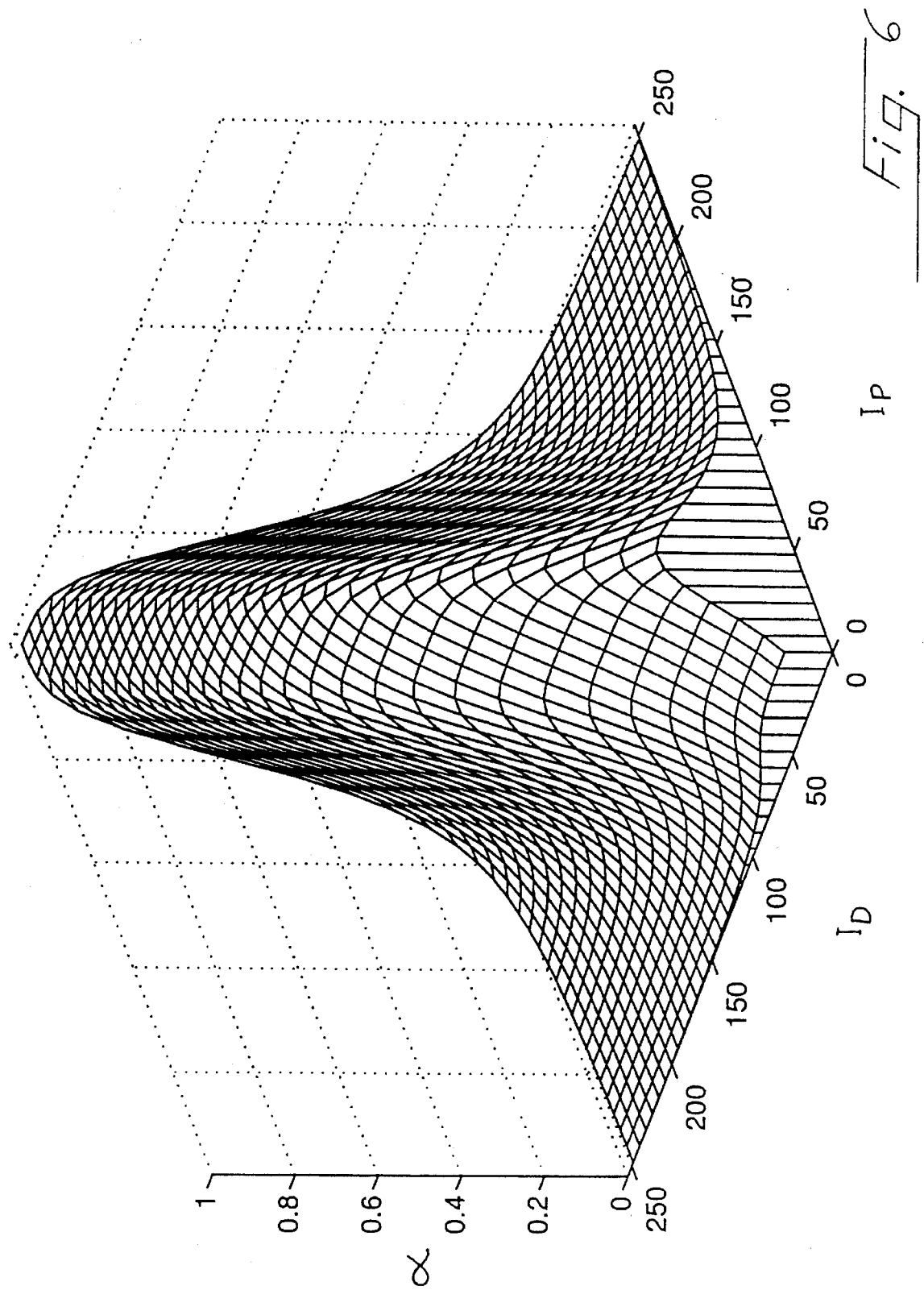
FIG. 6 is a graph of $\alpha(I_p, I_D)$ that relates to a second preferred embodiment of the display generator of FIG. 1.

FIGS. 5 and 6 relate to a second preferred embodiment of the display generator 14. In this case the display generator generates the output image signal $I_O$ as a monochromatic, two-dimensional mapping of $I_D$ and $I_p$:

$$I_O = F'(I_p, I_D). \tag{6}$$

The explicit form of $F'(I_p, I_D)$ is given by equation (7):

$$I_O = I_p + \alpha(I_p, I_D) \cdot (I_D - I_p), \tag{7}$$

where $\alpha(I_p, I_D)$ is a weighing factor which is a function of $I_p$ and $I_D$. $I_O$ is thus a weighted combination of $I_p$ and $I_D$. For example, when $\alpha$=0, $I_O$=$I_p$, and when $\alpha$=1, $I_O$=$I_D$. By varying $\alpha$ between 0 and 1, the output image signal $I_O$ can be made equal to any weighted combination of $I_p$ and $I_D$ between these two extremes.

The mean brightness of the output image $I_O$ is given by equation (8), where $\diamond$ denotes a spatial averaging operation:

$$<I_O> = <I_p> + <\alpha \cdot (I_D - I_p)> \tag{8}$$

For practical purposes, the second term of equation (8) will be zero or nearly zero. Hence, the mean brightness of the image signal $I_O$ will be approximately equal to that of $I_p$.

The function $\alpha$ can be designed based on known characteristics of ultrasound images. For example, noise in a dark background can be removed or substantially reduced by setting $\alpha$ close to zero when $I_p$ is low. In order to avoid the undesirable suppression of small objects in a dark background, $\alpha$ can be given a larger value when the difference between $I_p$ and $I_D$ is small. As long as the size of a small object is larger than the size of noise speckles, or the object is brighter than the noise, the value of $(I_D - I_p)$ tends to be smaller for the object than the noise. For this reason $\alpha$ is preferably set to zero when $I_p$ is low and $(I_D - I_p)$ is large. Similarly, when the intensity of the background is high ($I_p$ is large) and $(I_p - I_D)$ is large, $\alpha$ can be set close to zero to suppress dark holes in a bright background, reduce speckle noise, and achieve better contrast resolution in relatively bright tissue areas.

When $I_D$ and $I_p$ are nearly equal, $I_D$ represents mainly image details, especially when $I_p$ ranges from middle to high levels. In this case $\alpha$ is set to a high value to preserve these image details.

FIG. 6 illustrates a preferred form of $\alpha(I_p, I_D)$ which generally follows the considerations set out above. A good balance between noise suppression and detail preservation can be achieved by adjusting the width of the diagonally-extending ridge in FIG. 6 and varying the height of the ridge along the diagonal.

Figure 7:
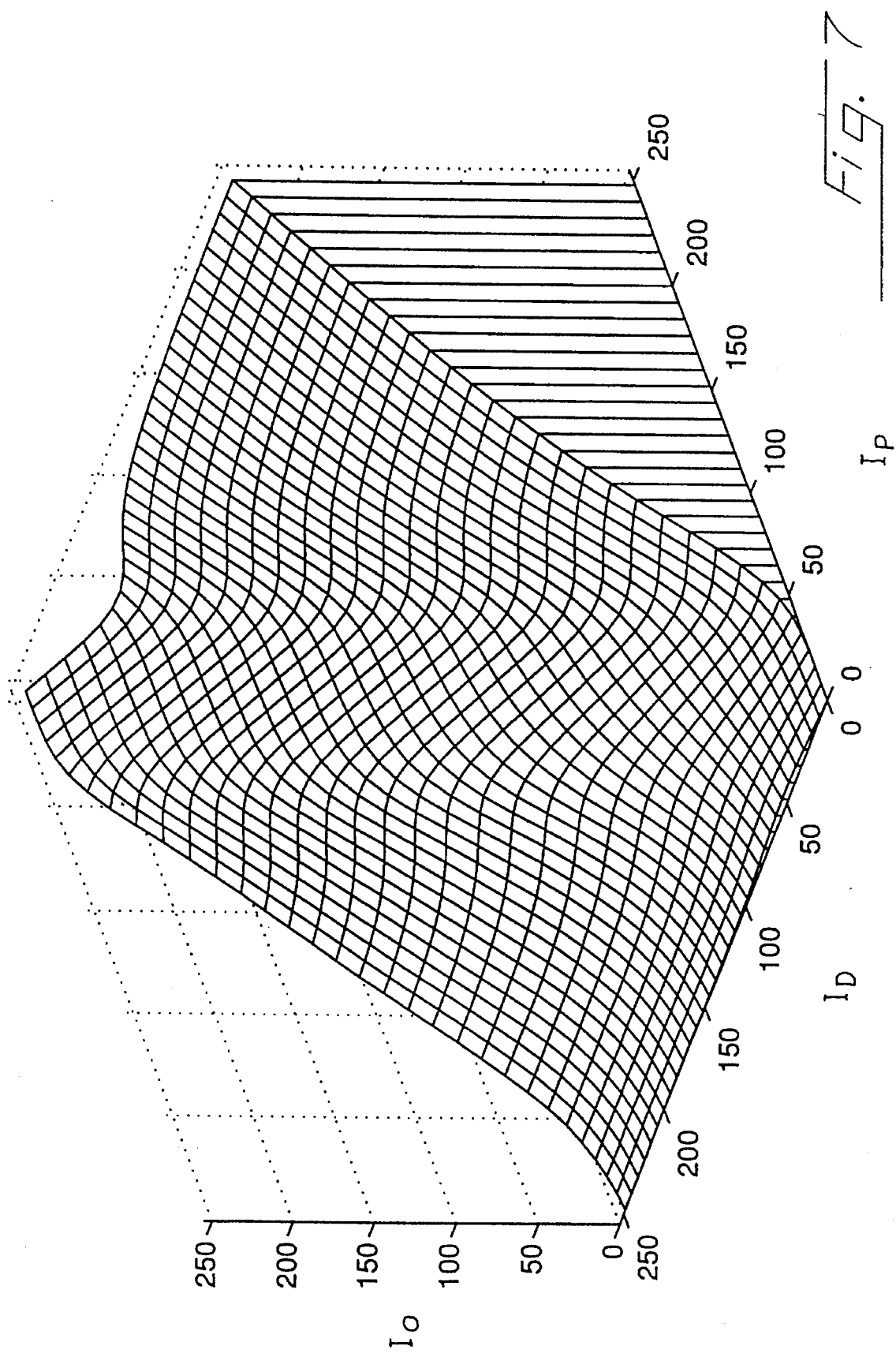
FIG. 7 is a graph of $F'(I_p, I_D)$ that relates to the second preferred embodiment of the display generator of FIG. 1.

The display generator 14 can be implemented as a two-dimensional look-up table having $I_p$ and $I_D$ as input addresses, because $\alpha(I_p, I_D)$ and consequently $F'(I_p, I_D)$ can be pre-calculated and stored in the table. FIG. 7 shows $I_O = F'(I_p, I_D)$, calculated using $\alpha(I_p, I_D)$ as shown in FIG. 6. Of course, several different look-up tables may be stored for use with particular applications or types of tissue or patient.

The approach discussed above in connection with FIGS. 6 and 7 provides the important advantage that it can suppress noise in dark areas (e.g. clutter in a blood pool) and reduce speckle noise in light tissue areas, with little or no loss of detail of small structures and edges. In addition, the mean brightness of the image is preserved.

The two-dimensional filter 12 of the display processor 10 is not required in all embodiments. The processed image signal $I_p$ can be generated in any suitable manner to provide valid contrast information between tissues of different types.

In some applications, it is highly desirable to suppress blood pool in the displayed image in order to enhance contrast and to emphasize boundaries. Motion information can readily be obtained as described below by measuring temporal coherence, or correlation between subsequent frames. This motion information can be used to detect blood pool and to suppress blood pool images without affecting tissue detail information.

Figure 8:
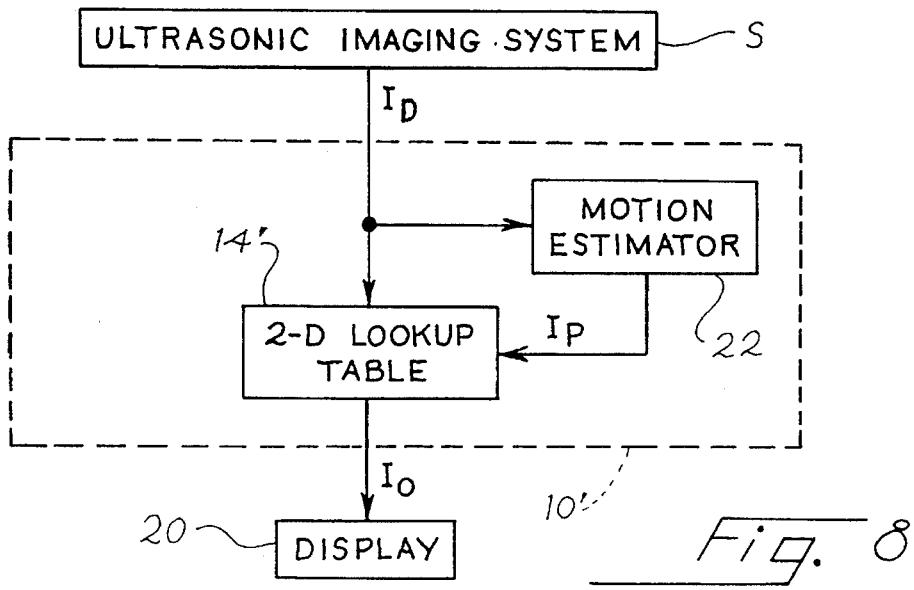
FIG. 8 is a block diagram of an ultrasonic imaging system that incorporates another embodiment of this invention.

FIG. 8 shows one such embodiment, which substitutes a motion estimator 22 for the two-dimensional filter 12 of FIG. 1. This motion estimator 22 supplies a processed image signal $I_p$ to a two-dimensional lookup table 14'.

The motion estimator 22 calculates the correlation coefficients (i.e., normalized cross-correlation at the zeroth lag) between two consecutive frames of the image signal $I_D$. Preferably, each frame is divided into subframes, each having a size of 20 $\lambda$ by 20 $\lambda$, where $\lambda$ is the wavelength of the center frequency of the imaging probe. Such sub-frames reduce computational requirements, while maintaining valid motion estimation. The loss in detail information is not crucial, since it is still provided in the high resolution image signal $I_D$.

The correlation coefficients are then interpolated and thresholded to distinguish between different velocities of motion. Low-pass filtering is used to provide smooth transitions between regions with different velocities. The resulting signal $I_p$ is a pixel by pixel signal that is used as an addressing signal for the lookup table 14'. The table 14' can be chosen to suppress regions with higher velocities of motion (such as blood pool), and thereby to enhance tissue contrast. The output signal $I_O$ generated by the table 14' can encode either a multicolor image or a monochromatic image as discussed above.

One of the standard operating modes of ultrasound imaging systems is the spectral Doppler mode. In this mode, the variation in the power spectrum of a Doppler shift frequency fd from a sample volume is displayed as a function of time. Time is plotted along the horizontal axis, frequency along the vertical axis. (Magnitude of the spectrum modulates the intensity.) The Doppler spectrum is proportional to the velocity distribution within the sample volume. The spectra from a flat velocity profile have a narrow bandwidth, while those corresponding to parabolic profiles have a wider bandwidth. Turbulent flow causes spectra to fluctuate rapidly with time.

The method described above for the B-Mode image enhancements can be used to improve spectral Doppler mode images as well. In this example, the first image signal $I_D$ is the conventional spectral Doppler signal $I_D(fd,t)$, and the second image signal $I_p$ is a processed spectral Doppler signal $I_p(fd,t)$, where $$I_p(fd,t)=I_D(fd,t)*h(fd)*h(t). \quad (8)$$

In Equation (8) * signifies convolution, and $h(fd)$ and $h(t)$ are filters in frequency and time, respectively. The filters $h(fd)$ and $h(t)$ are selected based on the feature that is to be enhanced.

For example, to enhance slow variations of power spectrum magnitude and to reduce noise (i.e., to increase contrast of the image), in frequency or time, the filters $h(fd)$ or $h(t)$ are set as low-pass filters. $I_p$ is then used to color code the magnitude using Equations (2) or (7). Alternately, to enhance fast variations, the filters $h(fd)$ and $h(t)$ can be set to be high-pass filters. For example, by using a high-pass filter $h(t)$ to produce $I_p$, and by color coding the output as described in Equation (2), turbulent flow or jets can be highlighted. The processor that produces $I_p$ can also be a nonlinear one (or combination of linear filters and nonlinear decision making) in order to extract special features, such as fast, time varying, and high velocity flow, or variance in the estimate.

In this embodiment, the image signal $I_D(fd,t)$ has a wider bandwidth than the image signal $I_p(fd,t)$, and the entity depicted by the image signals is a spectral Doppler plot rather than living tissue. The resulting output signal has a wider bandwidth portion that varies in accordance with $I_D(fd,t)$ and a narrower bandwidth portion that varies in accordance with $I_p(fd,t)$.

From the foregoing, it should be apparent that a wide range of changes and modifications can be made to the embodiments described above. $F(I_p, I_D)$, $F'(I_p, I_D)$ and $\alpha(I_p, I_D)$ can all be adapted as appropriate for the particular application. The display generator may directly determine $I_O$ from $I_p$ and $I_D$ (as by calculation for example), and may thereby eliminate the need for a look-up table. The widest variety of techniques can be used to generate $I_p$ and $I_D$, either by separate beamforming or by generating $I_p$ from $I_D$.

The present invention is not limited to use with ultrasonic imaging systems. Instead, it can be used with a wide variety of imaging systems, such as scanning electron microscopes for example. In addition, this invention can be used to enhance images of entities other than physical regions or objects. For example, images of entities such as waveforms or spectral Doppler data displays can be enhanced using the techniques discussed above. It is therefore intended that this detailed description be regarded as illustrative rather than limiting. It is the following claims, including all equivalents, that are intended to define the scope of this invention.

We claim:

1. An imaging system display processor that is responsive to first and second image signals depicting a common entity, said first image signal having a greater detail resolution than said second image signal, and said second image signal having greater contrast resolution than said first image signal, said display processor comprising:

a first input for receiving the first image signal;

a second input for receiving the second image signal;

means, coupled to the first and second inputs, for forming an output signal as a function of at least the first and second image signals, said output signal characterized by a brightness and a color, said brightness displaying the detail resolution of the first image signal, said color displaying the contrast resolution of the second image signal.

2. An imaging system display processor that is responsive to first and second image signals depicting a common entity, said first image signal having a greater detail resolution than said second image signal, and said second image signal having greater contrast resolution than said first image signal, said display processor comprising:

a first input for receiving the first image signal;

a second input for receiving the second image signal;

a look-up table having at least two dimensions and coupled to the first and second inputs and responsive to at least the first and second image signals to generate an output signal, said output signal combining both detail resolution of the first image signal and contrast resolution of the second image signal.

3. An imaging system display processor that is responsive to first and second image signals depicting a common entity, said first image signal having a greater detail resolution than said second image signal, and said second image signal having greater contrast resolution than said first image signal, said display processor comprising:

a first input for receiving the first image signal;

a second input for receiving the second image signal;

means, coupled to the first and second inputs, for forming an output signal as a weighted combination of at least the first and second image signals, said weighted combination comprising a weighing factor that varies in accordance with both of the first and second image signals.

4. The invention of claim 2 or 3 wherein the output signal encodes a monochromatic image.

5. The invention of claim 2 or 3 wherein the output signal encodes a multicolor image.

6. The invention of claim 3 wherein the weighing factor is selected to emphasize the second image signal when the second image signal is at a low level.

7. The invention of claim 3 or 6 wherein the weighing factor is selected to emphasize the second image signal when the second image signal is at a high level and the second image signal is substantially greater than the first image signal.

8. The invention of claim 3 or 6 wherein the weighing factor is selected to emphasize the first image signal when the first and second image signals are substantially equal.

9. An imaging system display processor that is responsive to first and second image signals depicting a common entity, said first image signal having a wider bandwidth than said second image signal, said display processor comprising:

a first input for receiving the first image signal;

a second input for receiving the second image signal;

means, coupled to the first and second inputs, for forming an output signal as a function of at least the first and second image signals, said output signal characterized by a wider bandwidth portion that varies in accordance with the first image signal and a narrower bandwidth portion that varies in accordance with the second image signal.

10. The invention of claim 9 wherein the output signal encodes a multicolor image.

11. A display processor for an imaging system that generates a first image signal depicting an entity comprising first regions of a tissue and second regions of blood, said display generator comprising:

means for generating a second image signal depicting the entity, said second image signal comprising reduced detail resolution and improved contrast resolution as compared to the first signal, said second image signal encoding multiple levels of contrast as appropriate to the tissue throughout the first region; and means for superimposing at least the first and second image signals to generate a composite image signal which combines detail information of the first image signal and contrast information of the second image signal.

12. The invention of claim 11 wherein the generating means comprises a two-dimensional filter.

13. The invention of claim 11 wherein the superimposing means comprises a two-dimensional lookup table.

14. The invention of claim 11 wherein the generating means comprises a motion estimator.

15. The invention of claim 11 wherein the first image signal is indicative of ultrasonic backscatter amplitude.

16. A display processor for an imaging system that generates a first image signal depicting an entity comprising first regions of a tissue and second regions of blood, said display generator comprising:

a motion estimator responsive to the first image signal and operative to generate a second image signal, said second image signal comprising reduced detail resolution and improved contrast resolution as compared to the first signal; and means for superimposing at least the first and second image signals to generate a composite image signal which combines detail information of the first image signal and contrast information of the second image signal.

17. The invention of claim 16 wherein the superimposing means comprises a two-dimensional lookup table.

18. The invention of claim 11 or 16 wherein the composite image signal encodes a multicolor image.

19. The invention of claim 1 or 2 or 3 or 9 or 11 or 16 wherein the first and second image signals depict ultrasonically measured features of the entity, and wherein the entity corresponds to a physical region.

* * * * *